(12) United States Patent
Ramet

(10) Patent No.: US 8,283,968 B2
(45) Date of Patent: Oct. 9, 2012

(54) ANALOG SWITCH

(75) Inventor: Serge Ramet, Jarrie (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 0 days.

(21) Appl. No.: 12/712,027

(22) Filed: Feb. 24, 2010

(65) Prior Publication Data

US 2010/0225379 A1    Sep. 9, 2010

(30) Foreign Application Priority Data

Mar. 3, 2009  (FR) ...................................... 09 51320

(51) Int. Cl.
  *H03K 17/16*  (2006.01)
  *H03K 17/687*  (2006.01)
(52) U.S. Cl. ........ 327/391; 327/407; 327/427; 327/434; 327/534
(58) Field of Classification Search .................. 327/391, 327/407, 427, 434, 534
See application file for complete search history.

(56) References Cited

U.S. PATENT DOCUMENTS

| | | | |
|---|---|---|---|
| 4,093,874 A | 6/1978 | Pollitt | |
| 4,529,897 A | 7/1985 | Suzuki et al. | |
| 5,689,209 A | 11/1997 | Williams et al. | |
| 5,731,732 A * | 3/1998 | Williams | 327/434 |
| 5,880,620 A * | 3/1999 | Gitlin et al. | 327/534 |
| 5,933,046 A | 8/1999 | Ramet et al. | |
| 6,154,085 A * | 11/2000 | Ramakrishnan | 327/404 |
| 6,670,790 B2 * | 12/2003 | Stellberger | 320/134 |
| 7,202,633 B2 * | 4/2007 | Nagai et al. | 320/134 |
| 7,710,189 B2 * | 5/2010 | Toda | 327/434 |
| 7,944,268 B2 * | 5/2011 | Okanobu | 327/434 |
| 2003/0016072 A1 | 1/2003 | Ramakrishnan | |
| 2006/0038604 A1* | 2/2006 | Miske | 327/427 |
| 2007/0097572 A1 | 5/2007 | Wu | |
| 2008/0231341 A1 | 9/2008 | Miske | |

OTHER PUBLICATIONS

French Search Report dated Sep. 8, 2009 from corresponding French Application No. 09/51320, filed Mar. 3, 2009.

* cited by examiner

*Primary Examiner* — Lincoln Donovan
*Assistant Examiner* — Colleen O Toole
(74) *Attorney, Agent, or Firm* — Wolf, Greenfield & Sacks, P.C.

(57) ABSTRACT

An analog switch including at least one first MOS transistor capable of transferring a signal from a first terminal to a second terminal; a connection circuit for bringing a substrate terminal of the first transistor to a voltage which is a function of the voltages of the first and second terminals; and a circuit for controlling a control voltage of the first transistor with the signal.

11 Claims, 3 Drawing Sheets

ANALOG SWITCH

CROSS REFERENCE TO RELATED APPLICATIONS

This application claims the priority benefit of French patent application number 09/51320, filed on Mar. 3, 2009, entitled "ANALOG SWITCH," which is hereby incorporated by reference to the maximum extent allowable by law.

BACKGROUND OF THE INVENTION

1. Field of the Invention

The present invention generally relates to electronic devices and, more specifically, to an analog switch made from a MOS transistor.

2. Discussion of the Related Art

FIG. 1 shows an analog switch 1 described in U.S. Pat. No. 5,933,046 (B2895-ST/95-GR2-084).

This switch is capable of operating in circuits supplied with a low voltage, for example, 3 volts. It comprises a P-channel MOS transistor M1. Drain D1 and source S1 of transistor M1 define input and output terminals U1 and U2 of switch 1. The substrate or bulk B1 is connected, via a constant current source 11, to a power supply terminal Vcc having a positive voltage. Gate G1 of transistor M1 is controlled by a voltage source, not shown. For example, gate G1 receives a logic signal Vg having two levels defining the on and off states of transistor M1.

For the analog switch to have a maximum voltage swing, the highest one of the voltages of terminals U1 and U2 is desired to be applied to the terminal of substrate B1. It being an analog switch, output terminal U2 is indeed likely to have a voltage which is sometimes greater, sometimes smaller than the voltage of input terminal U1 according to the direction in which the input voltage varies.

Transistors M2 and M3 are assembled symmetrically with respect to analog switch 1. Their respective gates G2 and G3 are connected to terminals U1 and U2. Their sources S2, S3 are connected to a common node N which is itself grounded via a constant current source 10. Drains D2, D3 of transistors M2 and M3 are connected to power supply terminal Vcc. Finally, a transistor M4 has its gate G4 and its drain D4 connected to substrate terminal B1 of transistor M1 and its source S4 connected to node N. Substrate terminals B2 to B4 of transistors M2 to M4, shown as floating, are generally connected to ground GND.

The operation of such an analog switch 1 is the following. Node N is brought to the highest one of the voltages of terminals U1 and U2, minus a threshold voltage (that of the associated transistor M2 or M3). For example, if the voltage of terminal U1 is greater than the voltage of terminal U2, transistor M2 behaves as a follower transistor and transfers the voltage of terminal U1 minus the threshold voltage of transistor M2 onto node N. As a result, on the one hand, transistor M3 is turned off (since its gate-source voltage becomes positive) and, on the other hand, substrate B1 has a voltage equal to the voltage of node N plus the threshold voltage of transistor M4. Since the threshold voltages of transistors M2 to M4 are almost equal, substrate B1 has a voltage substantially equal to the voltage of terminal U1. In this configuration, everything happens as if terminal B1 and source S1 of transistor M1 were directly connected, which thus minimizes the threshold voltage of transistor M1.

When terminals U1 and U2 both have a voltage smaller than the threshold voltage of transistors M2 and M3, the transistors turn off. Voltage Vb of substrate terminal B1 then has a minimum value equal to the threshold voltage of transistor M4. This results in an increase in the value of the threshold voltage of transistor M1, which generates a distortion of the signal copied on terminal U2. The linearity of the analog switch is altered for low-amplitude signals.

Further, the switch operation requires an external voltage source to apply a control voltage Vg on gate G1. This makes the configuration of this switch relatively complex.

US Patent Application 2003/0016072 discloses an analog switch comprising a main MOS transistor connecting input and output terminals, and two MOS transistors series-assembled between the input and output terminals, the midpoint of the series assembly being connected to the substrate of the main transistor and the gates of the three transistors being interconnected.

EP-A-0720270, FR-A-2509931 and WO-A-2007/051178 disclose other analog switch circuits.

SUMMARY OF THE INVENTION

It would be desirable to have an analog switch which overcomes all or part of the disadvantages of prior art.

In particular, it would be desirable to have an analog switch with a linear operation over as extended an operating range as possible.

It would also be desirable to have an analog switch of simple structure.

Thus, an embodiment of the present invention provides an analog switch comprising:

at least one first MOS transistor capable of transferring a signal from a first terminal to a second terminal;

a connection circuit for bringing a substrate terminal of said first transistor to a voltage which is a function of the voltages of the first and second terminals; and a circuit for controlling a control voltage of said first transistor with said signal.

According to an embodiment of the present invention, the control circuit comprises a second follower-assembled MOS transistor and a constant current source.

According to an embodiment of the present invention, the second transistor comprises a control terminal connected to the first terminal, a substrate terminal, and a first conduction terminal connected to a first supply terminal, via the current source, and a second conduction terminal connected to a second supply terminal.

According to an embodiment of the present invention, the connection circuit comprises a third and a fourth MOS transistors series-assembled between two conduction terminals of the first transistor, the third and fourth transistors having control terminals connected to the control circuit, and each having a substrate terminal and at least one conduction terminal connected to a first node common with a substrate terminal of the first transistor.

According to an embodiment of the present invention, an auxiliary circuit is provided to have the analog switch pass from an on state to an off state.

According to an embodiment of the present invention, the auxiliary circuit comprises fifth and sixth MOS transistors, the fifth transistor having a first conduction terminal connected to said first common node, a control terminal connected to an input terminal receiving a logic signal, and the sixth transistor having a control terminal connected to the input terminal and a first conduction terminal connected to the control circuit.

According to an embodiment of the present invention, the switch comprises two first transistors series-assembled between the two first and second terminals and each having a control terminal connected to the control circuit.

According to an embodiment of the present invention, the auxiliary circuit comprises a seventh MOS transistor connected by its control terminal to the input terminal, by its first conduction terminal to a second node common to the two first transistors and by its second conduction terminal to the second supply terminal.

The present invention also provides a analog signal switching circuit comprising at least one analog switch, connected to an analog-to-digital converter.

The foregoing objects, features, and advantages of the present invention will be discussed in detail in the following non-limiting description of specific embodiments in connection with the accompanying drawings.

DETAILED DESCRIPTION

Figure 1:
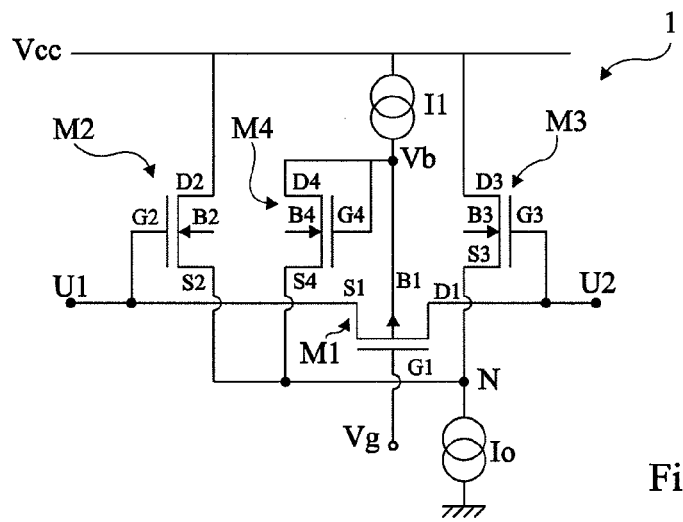
FIG. 1, previously described, shows an analog switch according to prior art.

For clarity, the same elements have been designated with the same reference numerals in the different drawings.

Figure 2:
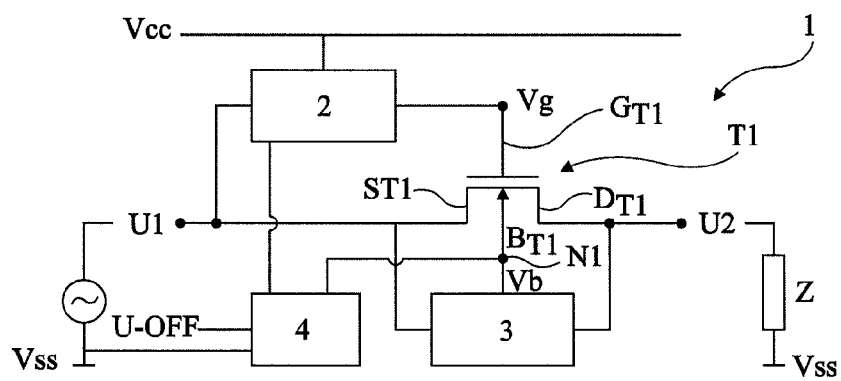
FIG. 2 is a block diagram of an analog switch with MOS transistors according to an embodiment of the present invention.

FIG. 2 is a functional block diagram of an embodiment of an analog switch 1.

Analog switch 1 comprises a first N-channel MOS transistor T1 between a terminal U1 (arbitrarily designated as the input terminal) and U2 (arbitrarily designated as the output terminal) of the switch. Typically, input terminal U1 receives any analog signal and output terminal U2 is connected to a load Z, for example, a capacitive load, connected to a low-voltage supply terminal Vss, generally corresponding to ground GND.

Input and output terminals U1 and U2 of analog switch 1 are show as respectively connected to source $S_{T1}$ and to drain $D_{T1}$ of transistor T1. The concept of source and drain is arbitrary, since the terminals of the transistor behaving as a source and drain depend on the respective voltages of terminals U1 and U2. Gate $G_{T1}$ of transistor T1 is connected, via a control circuit 2, to a high voltage supply terminal Vcc, for example at 3 volts. Its substrate or bulk terminal $B_{T1}$ is connected to a common node N1.

Circuit 2 has the function of controlling a voltage Vg of gate $G_{T1}$ of transistor T1 with any analog signal received on terminal U1. This control circuit 2 is performed so that the voltage between gate $G_{T1}$ and source $S_{T1}$ of transistor T1 remains constant and this, independently from the analog signal of input terminal U1 of analog switch 1.

Further, a connection circuit 3 for bringing substrate terminal $B_{T1}$ of transistor T1 to the lowest voltage taken from among the voltages of terminals U1 and U2 of the switch is provided between terminals U1 and U2.

Moreover, an auxiliary circuit 4 is provided between common node N1 and supply terminal Vss. This auxiliary circuit enables to control analog switch 1 to switch from an on state to an off state according to a logic signal received on an input terminal U_OFF of auxiliary circuit 4.

Figure 3:
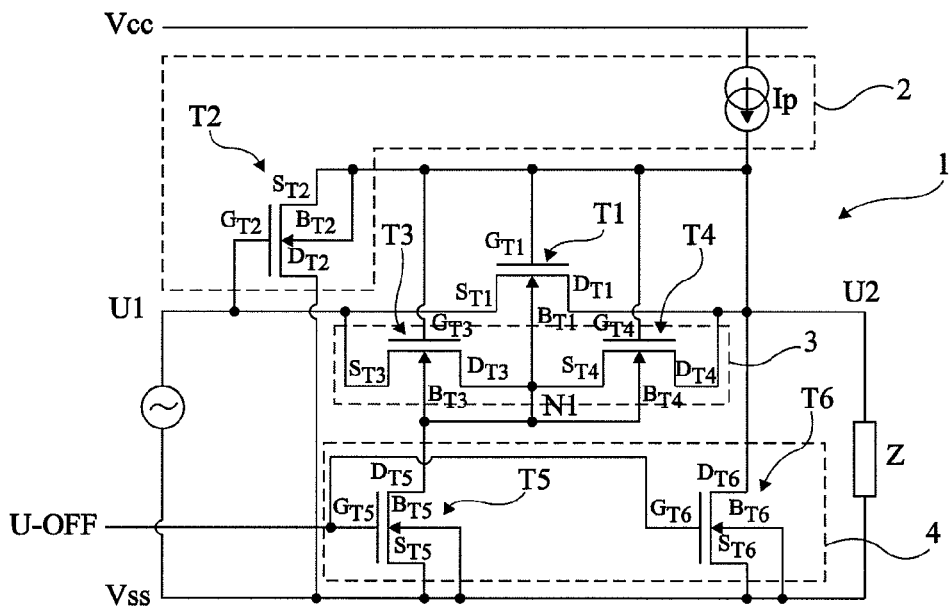
FIG. 3 is a detailed electric diagram of the switch of FIG. 2.

FIG. 3 is an electric diagram detailing an embodiment of control, connection, and auxiliary circuits 2, 3, and 4 of analog switch 1.

Control circuit 2 preferably comprises a second transistor T2 assembled as a follower transistor and a constant current source Ip. Gate $G_{T2}$ of transistor T2 is connected to terminal U1 to receive the analog input signal. Its drain $D_{T2}$ is connected to supply terminal Vss. Its source $S_{T2}$ and its substrate $B_{T2}$ are connected to gate $G_{T1}$ of transistor T1. Current source Ip connects gate $G_{T1}$ to supply terminal Vcc.

Transistor T2 and current source Ip copy the voltage of the analog signal by setting it off from the gate-source voltage of transistor T2, which is made approximately constant by current source Ip, to maintain the gate-source voltage of transistor T1 constant.

Connection circuit 3 is formed by third and fourth transistors T3 and T4 series-assembled between terminals U1 and U2 of analog switch 1. Their respective gates $G_{T3}$ and $G_{T4}$ are connected to gate $G_{T1}$ of transistor T1 to receive the same voltage. Source $S_{T3}$ of transistor T3 is connected to input terminal U1. Its drain $D_{T3}$ is connected to source $S_{T4}$ of fourth transistor T4 to form node N1. Drain $D_{T4}$ of transistor T4 is connected to terminal U2. Substrates $B_{T3}$ and $B_{T4}$ of transistors T3 and T4 are connected to substrate $B_{T1}$ of transistor T1 and to node N1, itself connected to auxiliary circuit 4.

Transistors T3 and T4 select the lowest one of the voltages of terminals U1 and U2 to apply it to substrate $B_{T1}$ of transistor T1. They have relatively small sizes as compared with the size of transistor T1 since the function of transistors T3 and T4 is to bias substrate $B_{T1}$ to the lowest voltage of terminals U1 and U2 and not to ensure the flowing of the current of the analog switch, which is preferentially conducted by transistor T1. Accordingly, the size of transistor T1 is selected so that its series resistance Rdson is low.

Auxiliary circuit 4 receives, on its input U_OFF, a two-state logic signal. For example, input terminal U_OFF receives a low state to deactivate auxiliary circuit 4 and turn on analog switch 1, and a high state to activate circuit 4 and turn off switch 1.

Auxiliary circuit 4 is formed by fifth and sixth N-type MOS transistors T5 and T6, of small size as compared with the size of transistor T1. Gates $G_{T5}$ and $G_{T6}$ of transistors T5 and T6 are connected to input U_OFF. Sources $S_{T5}$ and $S_{T6}$ of transistors T5 and T6 as well as their substrates $B_{T5}$ and $B_{T6}$ are connected to supply terminal Vss. Drain $D_{T5}$ of transistor T5 is connected to node N1 and drain $D_{T6}$ of transistor T6 is connected to current source Ip.

The operation of analog switch 1 is the following.

To activate analog switch 1, input U_OFF receives the low level of the logic signal. Output terminal U2 being loaded with a capacitive load Z, the latter stores the value of the signal applied to terminal U1 taken at a time prior to the setting of analog switch 1 to the on state.

It is for example assumed that when analog switch 1 is turned on, the voltage at terminal U1 is 0V, and the voltage at terminal U2 is 1V. As a result, the voltage at substrate terminal $B_{T1}$ is 0V (the lowest voltage between terminals U1 and U2). The source-substrate and gate-source voltages of transistors T1 are also equal to 0V. The drain-source voltage of this same transistor T1 is equal to 1V. The voltage of the gates of transistors T1, T3, and T4 is equal to the voltage of terminal U1 plus the constant gate-source voltage of transistor T2.

Thus, the gate-source voltages of transistors T1 and T3 are equal to this gate-source voltage of transistor T2. The gate-source voltage of transistor T4 is equal to the gate-source voltage of transistor T2 when the voltage of terminal U1 is smaller than the voltage of terminal U2. In the opposite case, this voltage is equal to the gate-source voltage of transistor T2 plus the difference between the voltages of terminals U1 and U2.

When the voltage at terminal U1 increases, the drain-source voltage of transistor T1 decreases. The gate-source voltages of transistors T1 and T3 remain constant, equal to the gate-source voltage of transistor T2. The gate-source voltage of transistor T4 increases. Transistor T3 or T4 which has a positive gate-source voltage, greater than its threshold voltage, and which has a drain or source voltage which is the lowest one of the voltages of terminals U1 and U2 is that which conducts first. In the above example, transistor T3 conducts and tends to bring the voltage of substrate $B_{T1}$ towards that of terminal U1. Transistor T4 remains off until its gate-source voltage is greater than its threshold voltage. If, conversely, it is started from a voltage of terminal U2 equal to 0V and from a voltage of terminal U1 equal to 1V, the functions of transistors T3 and T4 are inverted.

The gate-source voltage of transistor T1 being constant, the voltage of its source decreases, and transistor T1 tends to decrease the voltage at terminal U2 by discharging capacitive load Z, so that its drain $D_{T1}$ is at the same voltage as its source $S_{T1}$.

When the drain-source voltage of transistor T1 reaches a zero limiting value, a steady state is achieved. The voltages at terminals U1 and U2 also reach a common value induced by the zero value of the drain-source voltage of transistor T1. In steady state, the gate-source voltages of transistors T3 and T4 are positive and of same value. As a result, both transistors T3 and T4 are conductive. The voltage at node N1 is equal to the common value of the voltages of terminals U1 and U2. Accordingly, the gate-source voltage of transistor T1 becomes constant. The voltages of substrate $B_{T1}$ and of source $S_{T1}$ of transistor T1 are equal. Everything occurs as if a short-circuit was performed between substrate $B_{T1}$ and source $S_{T1}$ of this transistor, which corresponds to an optimum configuration since the threshold voltage of transistor T1 is then minimum.

Thus, the input signal is not given back on substrate $B_{T1}$ of transistor T1, which avoids the reproduction, on terminal U2, of any distortion of the signal present on terminal U1. Accordingly, transistor T1 has stable characteristics for any signal applied to terminal U1.

Further, since whatever the amplitude and the frequency of the signal received on terminal U1, the characteristics of transistor T1 remain unchanged, the stability of the source-gate voltage of transistor T1 is ensured over a wide frequency range. This enables the analog switch to have a good linearity as well as a rapidity of transfer from terminal U1 to terminal U2.

The fact of controlling the voltage of gate $G_{T1}$ of transistor T1 with the signal received at input terminal U1 enables to avoid for resistance Rdson of transistor T1 to be modulated by the analog input signal, and also contributes to providing a good linearity of the analog switch according to the frequency of the input signal.

When analog switch 1 is set to a non-conductive state, that is, when the signal applied on input terminal U_OFF is at its high level, gate $G_{T1}$ of transistor T1 and its substrate $B_{T1}$ are brought to the voltage of supply terminal Vss.

The voltage of gates $G_{T5}$ and $G_{T6}$ of transistors T5 and T6 is equal to that of input U_OFF, which turns them on. Common node N1 is connected to supply terminal Vss via transistor T5, and gates $G_{T1}$, $G_{T3}$, and $G_{T4}$ of transistors T1, T3, and T4 are connected to terminal Vss via transistor T6. Substrate $B_{T2}$ and source $S_{T2}$ of transistor T2 and current source Ip are connected to terminal Vss via the same transistor T6. Drains $D_{T5}$ and $D_{T6}$ of transistors T5 and T6 bring node N1 and current source IP to terminal Vss. Accordingly, all the transistors or diodes associated with these transistors are off. As a result, the coupling between terminals U1 and U2 is decreased.

Each of transistors T5 and T6 in the on state provides a resistance of a few tens of kilo-ohms, which brings the voltage of substrate $B_{T1}$ of transistor T1 down to voltage GND. This results in a good input-output isolation of analog switch 1, only limited by the native capacitive coupling intrinsic to the transistors and to the connections.

Figure 4:
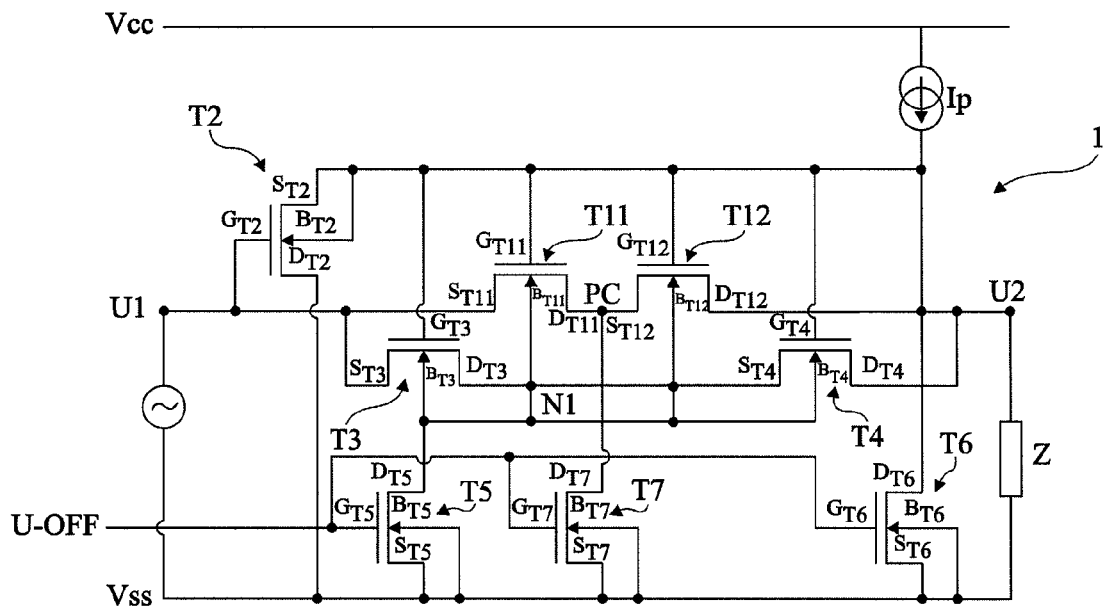
FIG. 4 is a detailed electric diagram of an analog switch according to another embodiment of the present invention.

FIG. 4 shows another embodiment of the analog switch.

Transistor T1 of the assembly of FIG. 3 is replaced with two transistors T11 and T12 series-assembled between input and output terminals U1 and U2 of analog switch 1. The configuration of transistors T2 to T6 remains unchanged. Gates $G_{T11}$ and $G_{T12}$ of transistors T11 and T12 are connected to source $S_{T2}$ of transistor T2 and substrates $B_{T11}$ and $B_{T12}$ of these transistors are connected to common node N1. Source $S_{T11}$ of transistor T11 is connected to terminal U1. Drain $D_{T12}$ of transistor T12 is connected to terminal U2. Drain $D_{T11}$ of transistor T11 and source $S_{T12}$ of transistor T12, defining a common node PC, are connected to supply terminal Vss via a seventh transistor T7. Source $S_{T7}$ and substrate $B_{T7}$ of transistor T7 are connected to terminal Vss. Its gate $G_{T7}$ is connected to gates $G_{T5}$ and $G_{T6}$ of transistors T5 and T6 to receive the same two-state logic signal. Its drain $D_{T7}$ is connected to node PC which is taken to the voltage of terminal Vss when the logic signal is in the high state, which enables to decrease the coupling between terminals U1 and U2. A better isolation is thus obtained.

Figure 5:
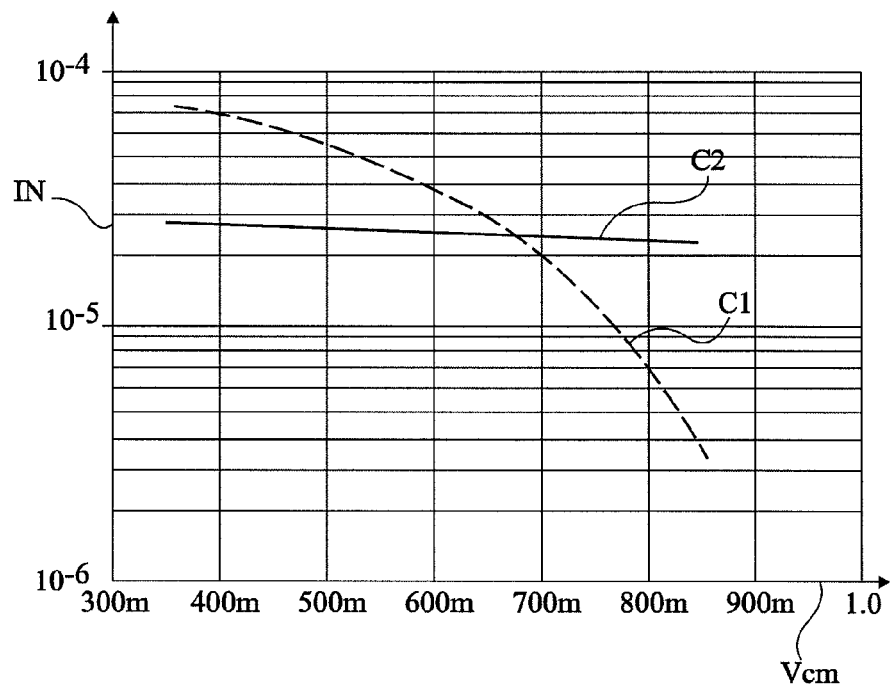
FIG. 5 is a graph comparing the variation, according to the common-mode voltage, of a series resistance of the analog switch according to the embodiment of FIG. 4 and according to prior art.

FIG. 5 compares the variation of series resistance Rdson of transistor T1, between an embodiment of the present invention and the state of the art. FIG. 5 shows the variation of an input current IN (expressed in amperes) versus a common mode voltage Vcm (expressed in volts).

One can infer the variation of the conductance of transistor T1 from curves C1 and C2 illustrated in FIG. 5, as well as the variation of series resistance Rdson, by taking the inverse of the conductance values. It should be noted that, according to curve C1, the series resistance of state-of-the-art transistor M1 is not linear and strongly varies according to voltage Vcm. According to curve C2, resistance Rdson of the embodiments of the present invention is substantially linear, independently from voltage Vcm.

Figure 6:
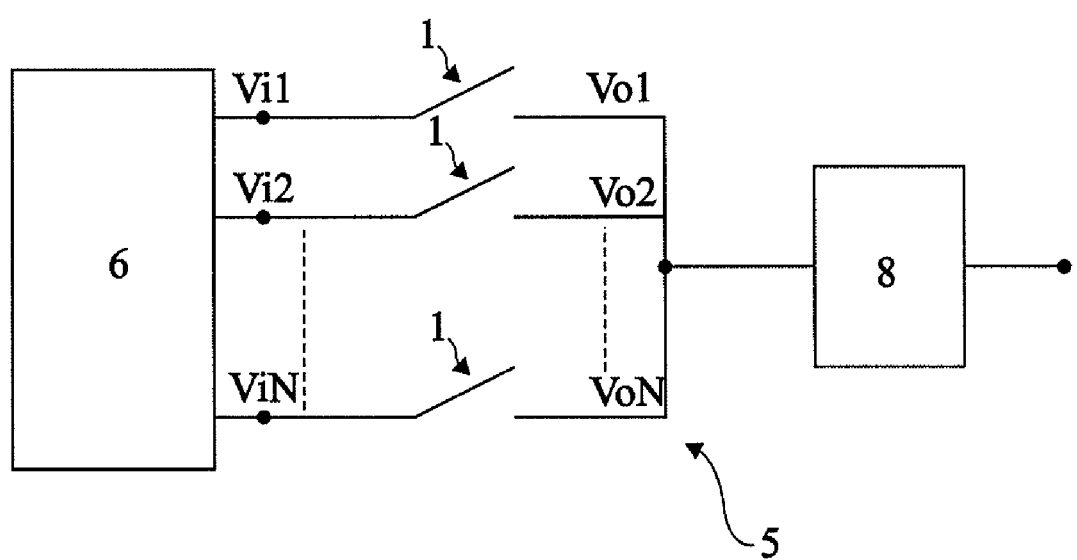
FIG. 6 shows, in the form of blocks, an example of application of an analog switch to an analog switching circuit.

FIG. 6 shows an example of application of analog switch 1 in an analog switching circuit 5. A block 7 of several analog switches 1 receives from an input block 6 input signals $V_{i1}$ to $V_{iN}$ corresponding to any input signal received on input terminal U1 of each switch. Each switch switches the signal received at the input $V_{i1}$ to $V_{iN}$ associated therewith to a corresponding output terminal $V_O$ to $V_{ON}$. A block 8, for example, an analog-to-digital converter, is connected to the respective outputs of block 7.

For circuits requiring a wide bandwidth, the preferred embodiment of analog switch 1 of above switching circuit 5 is that of FIG. 3. For circuits requiring a strong isolation between nodes U1 and U2 when the switch is off, the preferred embodiment of analog switch 1 of above switching circuit 5 is that of FIG. 4.

It is also possible to apply the present invention to any type of analog acquisition chain comprising several inputs and where a single input having a given functionality is desired to be selected.

As a specific embodiment, an analog switch such as described in FIG. 3 is sized as follows.

For a switch with an interdigitalized gate having a gate width of 0.13 micrometer, transistor T1 has forty gate fingers, transistor T2 has ten gate fingers, transistors T3 and T4 have two gate fingers, and transistors T5 and T6 have five gate fingers. Such an analog switch has, in steady state, a spectrum with a first harmonic at 600 MHz close to 0 dBc, and higher-order harmonics smaller than −70 dBc. It can thus be inferred that the analog switch according to the present invention has a very good linearity.

Specific embodiments of the present invention have been described. Various alterations and modifications will occur to those skilled in the art. In particular, an additional follower transistor may be placed in cascade with transistor T2, to control the gate-source voltage of transistor T1 with the voltage of terminal U1. Further, it will be within the abilities of those skilled in the art to adapt the analog switch of the present invention in any type of circuits. Moreover, in the example of the present invention, an N-type MOS transistor is used. The present invention also applies to P-type MOS transistors for which the bulk terminal is brought to a voltage corresponding to the highest voltage of terminals U1 and U2, by inverting the transistor types and the supply terminals.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An analog switch comprising:
at least one first MOS transistor capable of transferring a signal applied to a first terminal to a second terminal, without a capacitive element between the first terminal and the second terminal;
a connection circuit for bringing a substrate terminal of said first transistor to a voltage which is a function of the voltages of the first and second terminals;
a control circuit coupled to a first supply terminal, to said first terminal and to a control terminal of said first transistor for controlling a control voltage of said first transistor with said signal; and
an auxiliary circuit to have the analog switch pass from an on state to an off state in response to a logic signal, wherein the auxiliary circuit comprises fifth and sixth MOS transistors, the fifth transistor having a first conduction terminal connected to a first node common with a substrate terminal of the first transistor, a control terminal connected to an input terminal receiving the logic signal, and the sixth transistor having a control terminal connected to the input terminal and a first conduction terminal connected to the control terminal of said first transistor and directly connected to the second terminal, wherein the connection circuit comprises a third and a fourth MOS transistors series-assembled between two conduction terminals of the first transistor, the third and fourth transistors having control terminals connected to the control circuit, and each having a substrate terminal and at least one conduction terminal connected to the first node, and wherein the first conduction terminal of the sixth transistor is directly connected to the control terminals of the third and fourth transistors.

2. The analog switch of claim 1, wherein the control circuit comprises a second follower-assembled MOS transistor and a constant current source.

3. The analog switch of claim 2, wherein the second transistor comprises a control terminal connected to the first terminal, a substrate terminal, and a first conduction terminal connected to said first supply terminal, via the current source, and a second conduction terminal connected to a second supply terminal.

4. The analog switch of claim 1, comprising two first transistors series-assembled between the two first and second terminals and each having a control terminal connected to the control circuit.

5. The analog switch of claim 4, wherein the auxiliary circuit comprises a seventh MOS transistor connected by its control terminal to the input terminal, by its first conduction terminal to a second node common to the two first transistors and by its second conduction terminal to the second supply terminal.

6. An analog signal switching circuit comprising at least one analog switch of claim 1, connected to an analog-to-digital converter.

7. An analog switch comprising:
at least one first transistor configured to transfer a signal from a first terminal to a second terminal terminal, without a capacitive element between the first terminal and the second terminal;
a control circuit configured to control a voltage between the first terminal and a control terminal of the first transistor; and
an auxiliary circuit configured to switch the analog switch from an on state to an off state in response to a logic signal, the auxiliary circuit including fifth and sixth transistors, the fifth transistor having a first conduction terminal connected to a substrate terminal of the first transistor and a control terminal connected to an input terminal configured to receive the logic signal, and the sixth transistor having a control terminal connected to the input terminal and a first conduction terminal connected to the control terminal of the first transistor and directly connected to the second terminal, wherein the connection circuit comprises third and fourth transistors connected in series between two conduction terminals of the first transistor, the third and fourth transistors having control terminals connected to the control circuit, wherein the third and fourth transistors each have a substrate terminal and a conduction terminal connected to the substrate terminal of the first transistor, and wherein the first conduction terminal of the sixth transistor is directly connected to the control terminals of the third and fourth transistors.

8. An analog switch as defined in claim 7, wherein the control circuit comprises a second transistor and a constant current source connected to a first conduction terminal of the second transistor and wherein a control terminal of the second transistor is connected to the first terminal and the first conduction terminal of the second transistor is connected to the control terminal of the first transistor.

9. An analog switch as defined in claim 7, further comprising a connection circuit configured to adjust the substrate terminal of the first transistor to a voltage based on the voltages of the first and second terminals.

10. An analog switch as defined in claim 7, wherein the at least one first transistor comprises two first transistors connected in series between the first and second terminals, each having a control terminal connected to the control circuit.

11. An analog switch as defined in claim 10, wherein the auxiliary circuit further comprises a seventh transistor having a control terminal connected to the input terminal and a first conduction terminal connected to a load common to the two first transistors.

* * * * *

UNITED STATES PATENT AND TRADEMARK OFFICE
CERTIFICATE OF CORRECTION

PATENT NO. : 8,283,968 B2
APPLICATION NO. : 12/712027
DATED : October 9, 2012
INVENTOR(S) : Serge Ramet Page 1 of 1

It is certified that error appears in the above-identified patent and that said Letters Patent is hereby corrected as shown below:

Col. 1, line 25 should read:
source I1, to a power supply terminal Vcc having a positive Col. 1, line 41 should read:
via a constant current source I0. Drains D2, D3 of transistors Signed and Sealed this
Fourth Day of December, 2012

David J. Kappos
*Director of the United States Patent and Trademark Office*